United States Patent [19]

Gallagher et al.

[11] Patent Number: 5,291,923

[45] Date of Patent: Mar. 8, 1994

[54] DOOR OPENING SYSTEM AND METHOD

[75] Inventors: Gary M. Gallagher, Wappingers Falls, N.Y.; Gordon E. Johnson, Redding, Conn.

[73] Assignee: International Business Machines Corporation, Armonk, N.Y.

[21] Appl. No.: 949,960

[22] Filed: Sep. 24, 1992

[51] Int. Cl.$^5$ .............................. B65B 3/00; H05K 1/00
[52] U.S. Cl. ............................... 141/98; 141/46; 414/217; 414/292; 220/256
[58] Field of Search ............ 141/98, 1, 286, 387, 141/46, 85; 414/217–221, 292; 220/256

[56] References Cited

U.S. PATENT DOCUMENTS

| | | | |
|---|---|---|---|
| 4,020,861 | 5/1977 | Shihabi | 141/46 X |
| 4,532,970 | 8/1985 | Tullis et al. | 141/98 |
| 4,534,389 | 8/1985 | Tullis | 141/98 |
| 4,616,683 | 10/1986 | Tullis et al. | 141/98 |
| 4,724,874 | 2/1988 | Parikh et al. | 141/98 |
| 4,762,156 | 8/1988 | Rich | 141/46 |
| 4,913,200 | 4/1990 | Carow | 141/217 |
| 4,995,430 | 2/1991 | Bonora et al. | 141/98 |
| 5,137,063 | 8/1992 | Foster et al. | 141/98 |
| 5,178,197 | 1/1993 | Healy | 141/217 |
| 5,217,053 | 6/1993 | Foster et al. | 141/98 |

*Primary Examiner*—Ernest G. Cusick
*Attorney, Agent, or Firm*—Graham S. Jones, II; Harold Huberfeld

[57] ABSTRACT

A reusable isolation structure features an easily cleanable shell. The opening of the shell includes a groove formed around the periphery thereof and is preferably not more than slightly smaller than an interior cross-section of the shell. A closure member (door) of the isolation structure is dimensioned to fit within the opening and has a resilient seal member clamped to the periphery of a backbone by front and rear plates. The front and rear plates cooperate with grooves formed in the backbone to define a preferred form of manifold for coupling pressure or a vacuum to the interior of the resilient seal member whereby the resilient seal member may be collapsed to allow removal of the closure member or allowed to expand or pressurized to provide secure closure member. A vacuum structure for handling the closure member simultaneously provides for evacuation and controlled collapse of the resilient seal member as well as containment of contamination of the exterior thereof.

6 Claims, 4 Drawing Sheets

DOOR OPENING SYSTEM AND METHOD

CROSS REFERENCE TO RELATED APPLICATIONS

"ISOLATION STRUCTURE FOR CONTAMINATION SENSITIVE ITEMS"; Inventors: L. B. Cook, R. F. Florence, G. M. Gallagher, G. E. Johnson and R. W. Sargent; Ser. No. 07/950,110, Filed: Sep. 24, 1992 commonly assigned and filed concurrently herewith (referred to hereinafter as Cook et al.)

"GAS PURGE SYSTEM FOR ISOLATION ENCLOSURE FOR CONTAMINATION SENSITIVE ITEMS", Inventors: R. L. DeAngelis and G. M. Gallagher; Ser. No. 07/949,959, Filed: Sep. 24, 1992 commonly assigned and filed concurrently herewith (referred to hereinafter as DeAngelis et al.)

BACKGROUND OF THE INVENTION

1. Field of the Invention

This invention relates to packaging enclosure members and door opening systems and methods of operating such door opening systems for such enclosure members. More particularly this invention relates to enclosure members for the packaging of items and packaging structures for isolating contamination sensitive items such as electronic components.

2. Description of related art

For many years, packaging has been an integral part of the transportation and delivery of products to users. One principal function of packaging for these purposes has been to provide ease of handling and space efficient storage of the product, prior to use.

A further and often more important function of such packaging is the protection of the product from the time of production or manufacture until the time of use. Such protection has become particularly critical for electronic circuit components which are often subject to damage from a wide range of environmental conditions. Such conditions include, but are not limited to, accelerations during handling, such as impacts against surfaces, vibration, static electricity and contamination by vapors and particles and tampering.

Standardized mechanical interface (SMIF) systems have been designed for reducing particle contamination, including hermetically sealable, transportable containers.

U.S. Pat. No. 4,724,874 of M. Parikh for "Sealable Transportable Container Having a Particle Filtering System" provides a transportable container with a box with an interior space for containing articles, The box has a conduit for communicating between the interior space and the environment outside the box. The conduit contains a filter for filtering fluids passing through the conduit for alternate evacuation or pressurization. In discussing the prior art, U.S. Pat. No. 4,723,874, Cols.1 and 2, states as follows:

"A standardized mechanical interface (SMIF) has been proposed by the Hewlett-Packard Company as disclosed in U.S. Pat. Nos. 4,532,970, and 4,534,389. The purpose of the SMIF system is to reduce particle fluxes onto wafers. This end is accomplished by mechanically ensuring that during transportation, storage and processing of the wafers, the gaseous media (such as air or nitrogen) surrounding the wafers is essentially stationary relative to the wafers and by ensuring that particles from the ambient environment do not enter the immediate wafer environment. The SMIF system above consists of two parts:

"(1) a controlled environment including a clean process equipment canopy surrounding the wafer-handling mechanism of each processing machine, and "(2) a small, clean box having a quiet internal environment for carrying wafers from processing machine to processing machine.

"Systems of the above type are concerned with particle sizes which range from below 0.1 micrometers to above 200 micrometers. Particles with these sizes can be very damaging in semiconductor processing because of the small geometries employed in fabricating semiconductor devices. Typical semiconductor processes today employ geometries which are 1 micrometer and under. Unwanted contamination particles which have geometries measuring greater than 0.1 micrometer substantially interfere with 1 micrometer geometry semiconductor devices. The trend, of course, is to have smaller and smaller semiconductor processing geometries which today in research and development labs approach 0.1 micrometer and below. In the future, geometries will become smaller and smaller and hence smaller and smaller contamination particles become of interest.

"In typical processing environments today, 'clean rooms' are established in which through filtering and other techniques, attempts are made to remove particles having geometries greater than 0.03 micrometers and above. There is a need, however, to improve the processing environment. In a clean room, wafers and other semiconductor processing articles are exposed to the full clean room environment. Since different people, different types of equipment and materials are also present in the clean room environment, the clean room cannot be maintained as particle free as desired. It is virtually impossible to maintain clean rooms free of particles of a 0.1 micrometer size and below.

"For this reason, systems such as the SMIF system have come under consideration. The proposed SMIF system, however, has some deficiencies. When SMIF boxes become contaminated, it is very difficult to remove small contaminant particles since the force of attraction of small particles to surfaces of the equipment is very high. When small particles become attached to a surface such as a SMIF box, they are not effectively removed by filtration techniques. Circulating and filtering air or other gas within a box does not readily remove the contamination particles which are attracted and hold in contact with surfaces. However, whenever an object such as a SMIF box is disturbed, by bumping for example, many small particles are freed from the surface and find their way as contaminants onto any semiconductor or other article which is present in the box. While scrubbing and washing techniques have been developed for removing small particles from equipment and surfaces, these processes tend to be cumbersome and furthermore are not entirely effective."

The Parikh patent states further, "Previous SMIF concepts have included the principle that the wafers move from the transportable container to the processing equipment through various apparatus by disturbing the least amount of air within the processing equipment. Thus the still air concept has pervaded prior SMIF transportable containers. The advantage of this is that any particulates in the air would not damage semiconductor wafers because the air remained relatively still during the transferring process. While this principle is still valid, it has been found that stagnant air too, has many particles which may also cause damage simply by static attraction. The recognition that stagnant air causes contamination and damage has created a need for active localized filtering of the SMIF box and the environments with which the semiconductor articles are exposed. This recognition is a departure from the previous SMIF concept which employed no active filtering means. The need for active filtering at localized areas and under specific conditions and at desired times has been left to this invention."

The same U.S. Pat. No. 4,724,874 of M. Parikh for "Sealable Transportable Container Having a Particle Filtering System" provides a transportable container with a box with an interior space for containing articles. The box has a conduit for communicating between the interior space and the environment outside the box. The conduit contains a filter for filtering fluids passing through the conduit for alternate evacuation or pressurization. The Parikh et al patent states, at the end of Col. 2 thereof, "In accordance with the above background, there is a need for an improved system which can be standardized and which is effective for reducing contamination using an active filtering system."

It is important for packaging to protect against contamination or tampering (e.g. removal and replacement of the device in a protective, shock absorbing packaging foam under conditions where damage could occur).

The maintenance of an adequately clean manufacturing environment has led to increased manipulation of the packaging and items contained therein by automated processing equipment. Therefore, isolation structures must be adapted to be manipulated by such equipment in addition to providing the required types of protection for the packaged items. This adaptation often requires both the packaging and the automated equipment to be specially modified and standardized, increasing costs and reducing the generality of application of the automated equipment.

It is accordingly important that such equipment can be opened and closed with maximum efficiency while maintaining the clean environment about the materials housed within the enclosure member during the process of opening and closing.

SUMMARY OF THE INVENTION

It is therefore an object of the present invention to provide an isolation structure for isolation of the contents from the external environment which will simultaneously provide for protection of an item contained therein from contamination by particles or vapors generated either internally or externally of the isolation structure as well as protection from impacts, vibration, static electricity and tampering.

It is a further object of the invention to provide an isolation structure which seals the contents of the structure from the external environment, but which does not alter the internal or external dimensions of the isolation structure and provides a smooth interior surface thereof.

It is another further object of the invention to provide an isolation structure which can be readily handled by automated equipment without specific adaptation thereof to accommodate the particular geometry of the isolation structure.

In order to accomplish these and other objects of the invention, an isolation structure is provided including a shell, having a opening, and a closure member (door), dimensioned to be received within the opening, including a closure member body having an outer periphery and a resilient seal member on the outer periphery of the closure member body defining at least a portion of an interior space within the resilient seal member and forming at least a portion of an outer surface of said door, and means for communicating pressure or a partial vacuum from the outer surface of the closure member to the interior space within the resilient seal member.

In accordance with another aspect of the invention, a closure member is provided including a closure member body having an outer periphery and a resilient seal member on the outer periphery of the closure member body defining at least a portion of an interior space within the resilient seal member and forming at least a portion of an outer surface of the door, and means for communicating pressure or a partial vacuum from the outer surface of the closure member to the interior space within the resilient seal member.

Further in accordance with this invention, a system for operating a closure member includes a) said closure member having 1) a resilient member located on at least a portion of the periphery of the closure member, the resilient member and the closure member defining a first volume, and 2) a manifold for communication of gas and gas pressures between the first volume and the surface of the closure member, b) a structure for application to the surface of the closure member to define a second volume between the surface of the closure member and the structure, c) means for drawing a partial vacuum within the second volume, and d) means for communicating the partial vacuum through an aperture on the closure member from the second volume to the manifold to the first volume. Preferably, the system further includes means for attaching the resilient member to the closure member body; and preferably, the closure member body includes a backbone and the means for attaching the resilient member to the backbone includes front and rear plates. Preferably the front plate provides a smooth outer surface of the closure member; while preferably the front plate has at least one aperture formed therein.

Preferably, the means for communicating pressure or a partial vacuum from the outer surface of the closure member to the interior space within the resilient member comprises manifold means at least partially enclosed within the closure member body. Preferably, the means for communicating pressure or a partial vacuum from the outer surface of the closure member to the interior space within the resilient member comprises manifold means at least partially enclosed within the closure member body and a portion of the manifold means is formed by grooves located on a surface of the backbone and the front plate, including the at least one aperture. It is preferred that a portion of the manifold means is formed by grooves located on a surface of the backbone.

It is preferred that means are included for locating at least one of the front plate and the back plate relative to the backbone; and there are means for locating at least one of the front plate and the back plate relative to the backbone includes locating pins; and the means for locating at least one of the front plate and the back plate relative to the backbone includes an O-ring.

A closure member for a system including a) a closure member body having an outer periphery and a resilient member on the outer periphery of the closure member body, the resilient member defining at least a portion of an interior space within the resilient member and forming at least a portion of an outer surface of the closure member, and b) means for communicating pressure or a partial vacuum from the outer surface of the closure member to the interior space within the resilient member.

Means are provided for attaching the resilient member to the closure member body; and the closure member body includes a backbone and the means for attaching the resilient member to the closure member body includes front and rear plates. Preferably the front plate provides a smooth outer surface of the closure member and/or the front plate has at least one aperture formed therein.

Preferably the means for communicating pressure or a partial vacuum from the outer surface of the closure member to the interior space within the resilient member comprises manifold means at least partially enclosed within the closure member body. Preferably, a portion of the manifold means is formed by grooves located on a surface of the backbone. In addition the means for communicating pressure or a partial vacuum from the outer surface of the closure member to the interior space within the resilient member comprises manifold means at least partially enclosed within the closure member body and a portion of the manifold means is formed by grooves located on a surface of the backbone and the front plate, including the at least one aperture. Preferably, further means are included for locating at least one of the front plate and the back plate relative to the backbone; and the means for locating at least one of the front plate and the back plate relative to the backbone includes locating pins. The means for locating at least one of the front plate and the back plate relative to the backbone includes an O-ring. The means for locating at least one of the front plate and the back plate relative to the backbone further includes a breather body. The system encapsulates the closure member to isolate by employing a cover with a perimeter seal for preventing contamination from entering a clean environment when opening the closure member. The system applies suction to the closure member to collapse the seal.

In another aspect of the invention, a sealed closure member and opening include a) a opening, b) a closure member dimensioned to be received within the opening, the closure member including 1) a closure member body having an outer periphery and 2) a resilient member secured to the outer periphery of the closure member body, the resilient member defining at least a portion of an interior space within the resilient member and forming at least a portion of an outer surface of the closure member, and c) means for communicating pressure or a partial vacuum from the outer surface of the closure member to the interior space within the resilient member for locking and unlocking the closure member.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
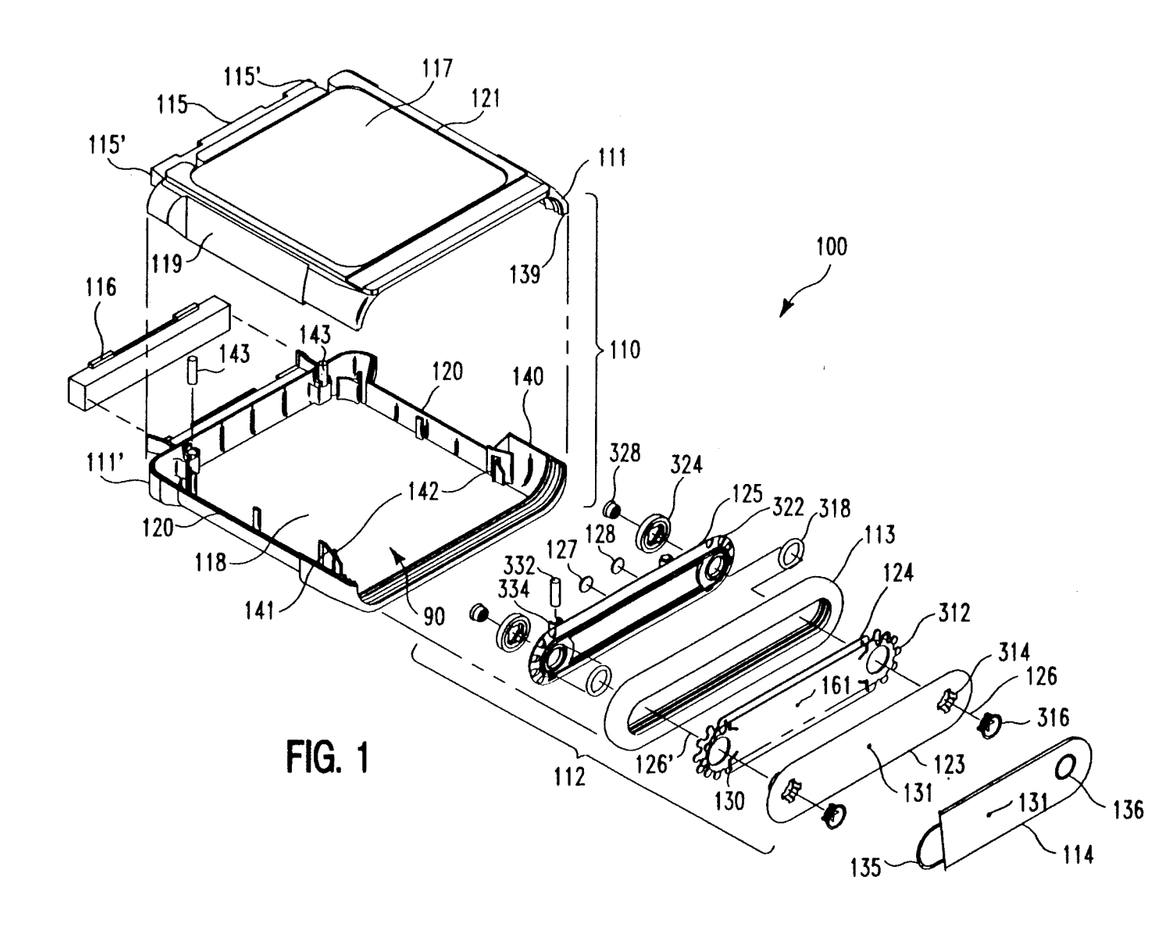
FIG. 1 is an exploded view of the isolation structure in accordance with the invention.

Referring now to the drawings, and more particularly to FIG. 1, there are shown, in an exploded view, the constituent components of the isolation structure 100 including a closure member (door) 112 embodying a closure member opening 90 system constructed and operating in accordance with this invention. The isolation structure has two major parts, a shell 110 and the removable closure member 112. Shell 110 can preferably be fabricated from two portions 111, 111' by casting, injection molding, machining, or any other suitable technique. If the shell 110 is so formed, the portions 111, 111' are preferably permanently joined by hot platen welding to provide a hermetic seal with no flash at the joint. However, other joining techniques and materials may be used such as adhesives as long an care is taken to avoid materials and formations which could form a source of loose particles or vapors (e.g. a solvent in an adhesive) which could be a source of contaminants. In any case, shell portions 111, 111' are preferably formed with interlocking edge structures 139, 140 and possibly interlocking tabs such as 141 to enhance the structural integrity of the shell when the shell portions 111, 111' are joined. Whatever technique or materials are utilized to join the shell portions, it is preferable that the full extent of such locating or interfitting structures be involved (e.g. a full depth weld) so that no internal crevices will remain after the shell portions are joined.

The shell 110, when completed, has no moving parts or internal concave structures and thus may be easily cleaned. The major portion of the interior is preferably planar to facilitate cleaning and the opening 90 into which the closure member 112 is to be fit is no smaller than the internal cross-sectional shape of the shell interior.

The planar major surfaces, such as 118, of the interior of the shell also preferably cooperate with planar outer surfaces 117 to form viewing windows so that the contents of the isolation structure 100 may be inspected while maintaining isolation from the ambient atmosphere. For this reason, transparent materials are also preferred. Additionally, further viewing windows may be provided in the sides of the shell such as at 119. It is preferable, if the shell 110 is formed in two portions, to avoid having a joint between such portions crossing the side viewing windows. Therefore, window 119 is preferably formed on one of the portions 111 and a corresponding notch 120 formed on the other portion 111' to receive an edge thereof. It is also possible to form any of the viewing windows 117, 119 as a separate structure around which two or more portions of the shell 110 are fitted. However, since suitable transparent materials having low outgassing properties and low rates of shedding (e.g. loss of particles from the surface) are readily available, lowest cost is achieved by integral formation of the viewing windows in the shell portions 111, 111'. Examples of such suitable materials are PC (Polycarbonate), PMMA (Poly methylmethacrylate) and PETG (Polyethylene terepthalate—glycol modified).

These materials are also particularly suitable since they are somewhat conductive and thus dissipate static electricity.

It is contemplated that the item contained within the optical enclosure member 100 may be provided with bar code indicia such as a universal product code label for identification of the item contained in the isolation structure to thus allow direct, automated identification thereof. Therefore, viewing windows must be maintained in good optical condition. To avoid scratching of the viewing windows and to maintain good optical properties thereof, the viewing windows are preferably either recessed slightly from the shell exterior (as shown at viewing window 119) or a stacking structure provided, preferably in the form of a raised frame margins 121 and 122, or both. The raised margins 121 and 122 are preferably dimensioned to be functionally combined with a stacking structure, as indicated at 121 and 122 in FIG. 2. The windows are preferably formed symmetrically on major faces and edges of the shell to avoid the need to reorient items to be inserted therein during automated insertion of items into the isolation structure 100.

The interior of shell 110 is preferably formed as symmetrically as possible in the vertical direction in order to accommodate an object placed therein in either of two orientations. This feature allows the avoidance of inversion of the object regardless of the orientation of the shell 110. This is particularly advantageous where it allows the provision of additional automated packaging machinery to be avoided to invert the objects. If stacking features such as raised frame margins 121, 122 (see FIG. 2) are provided on the exterior of the shell 110, symmetry of the exterior of the shell may not be possible. However, symmetry at the opening 90 of the isolation structure shell is sufficient to obtain simplification of the object insertion process.

Shell 110 is also preferably formed with an external projection 115, at the opposite end from the opening 90 for closure member 112, which projection 115 can be used to position the shell 110 during the insertion or removal of the contents thereof. The projection 115 can also be used as a location for a process identification tag 116, preferably formed as an insert held between projections 115, or other identifying indicia. While no particular exterior dimensions or shapes are required for projection 115 or in combination with insert 116, it is considered preferable that the lateral ends 115' of projection 115 be angled, bevelled, rounded or otherwise shaped to facilitate gripping or handling of the shell and separation of several stacked shells when stacked employing stacking structures 121 and 122 of FIG. 2.

The closure member 112 in accordance with the invention is a composite structure; the principal constituent parts of which are a closure member body, preferably including a backbone 124, and a resilient pneumatic seal member 113. The backbone 124 supports the general shape of the resilient seal member 113 to generally conform to the shape of the opening 90 in shell 110. Preferably, the backbone 124 also provides pneumatic manifolding 130 to communicate with the interior of the resilient seal member 113, as will be described in greater detail below for the purpose of unlocking the closure member in accordance with this invention. The edges of the backbone 124 are also preferably cup-shaped in cross-section, as best illustrated at 132 of FIG. 2 to form an elongated toroidal interior volume when resilient seal member 113 is installed thereon. Accordingly, apertures are provided in the cup-shaped edge of backbone 124 in accordance with the manifolding structure utilized. It is to be understood that while providing manifolding within the closure member body is preferred, it is only necessary to be able to communicate pressure or partial vacuum to the interior space defined, in part, by the resilient seal member and a closable opening, tube or other arrangement which could be provided directly on the resilient seal member, itself.

Figure 2:
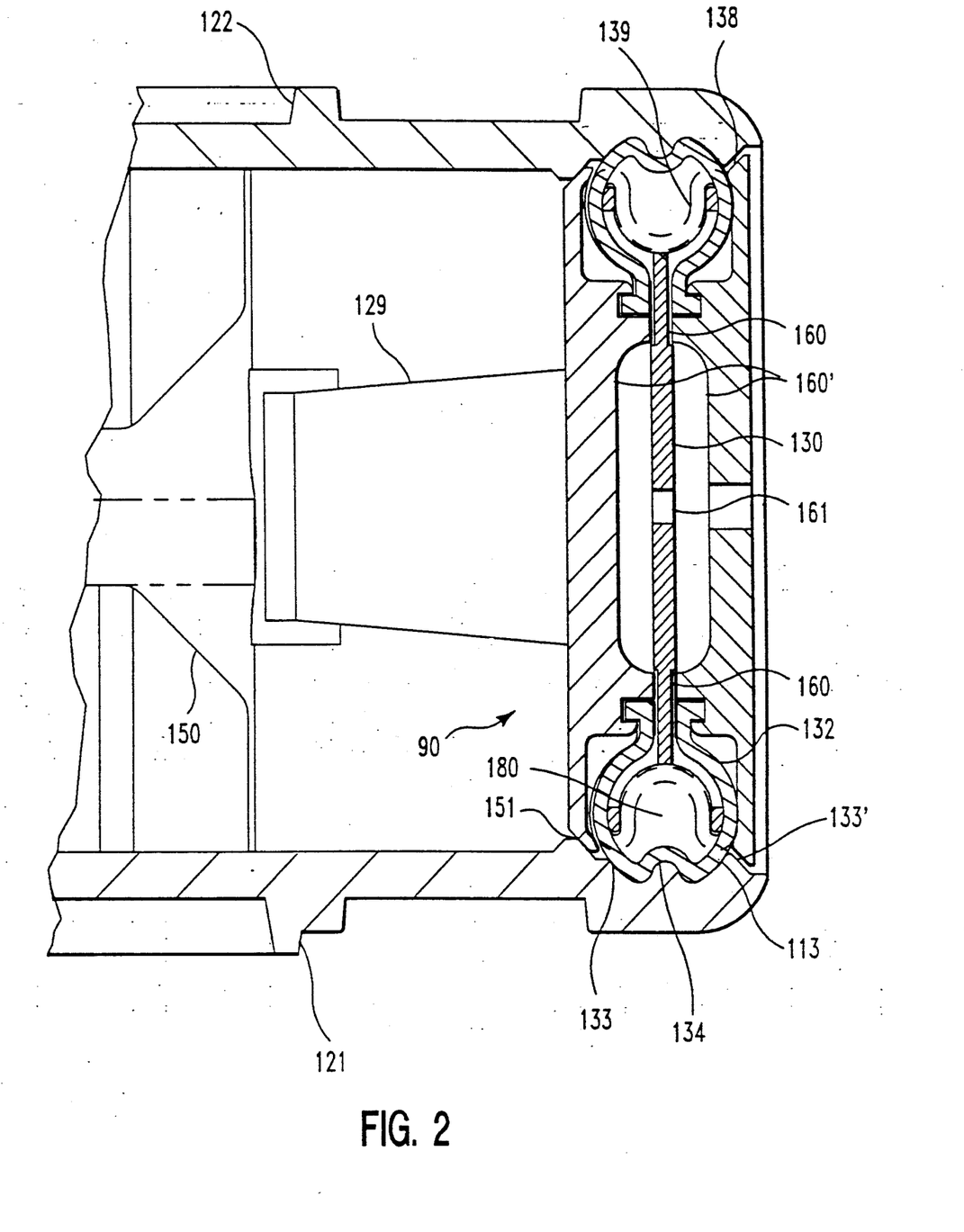
FIG. 2 is a cross sectional view of the closure member and seal structure of the isolation structure illustrated in FIG. 1, and including a portion of the shell of the isolation structure.

With further reference to FIG. 2 as well as FIG. 1, to complete the major structure of the closure member 112, the closure member body preferably further includes front plate 123 and rear plate 125. As shown in FIG. 2, the front and rear plates clamp respective margins of resilient seal member 113 against outer sides of the cup-shaped edges 132 of the backbone 124. The front and rear plates 123, 125, in conjunction with the backbone, also mechanically constrain the resilient seal member 113 and provide controlled collapse of the seal member 113 when the interior volume of closure member 112 is evacuated. The "interior volume" to be evacuated includes spaces 170 and 180 in hollow closure member 112 as well as the pneumatic manifolding 130. The space 170 is the space between the front plate 123 and the back plate 125. The hub space 180 is defined by the volume between the pneumatic seal member 113 and the cup-shaped edges 132 of the closure member backbone 124. Of course, it is to be understood that this definition of the "interior volume" is directed to the particular shapes and topologies of the constituent parts of the preferred embodiment of the invention and basically includes all interior space of the closure member which is in communication with the interior (hub space) 180 of the resilient seal member 113, thus constituting "manifolding" regardless of its configuration. It should also be understood that the "manifolding" may, in fact, occupy only a very minor fraction of the interior space which may exist in the closure member 112. It is considered, however, that increased volume of the manifolding may increase tamper resistance by requiring evacuation of a greater volume which is more likely to require specialized apparatus for successful collapsing of the resilient seal member 113.

Figure 3:
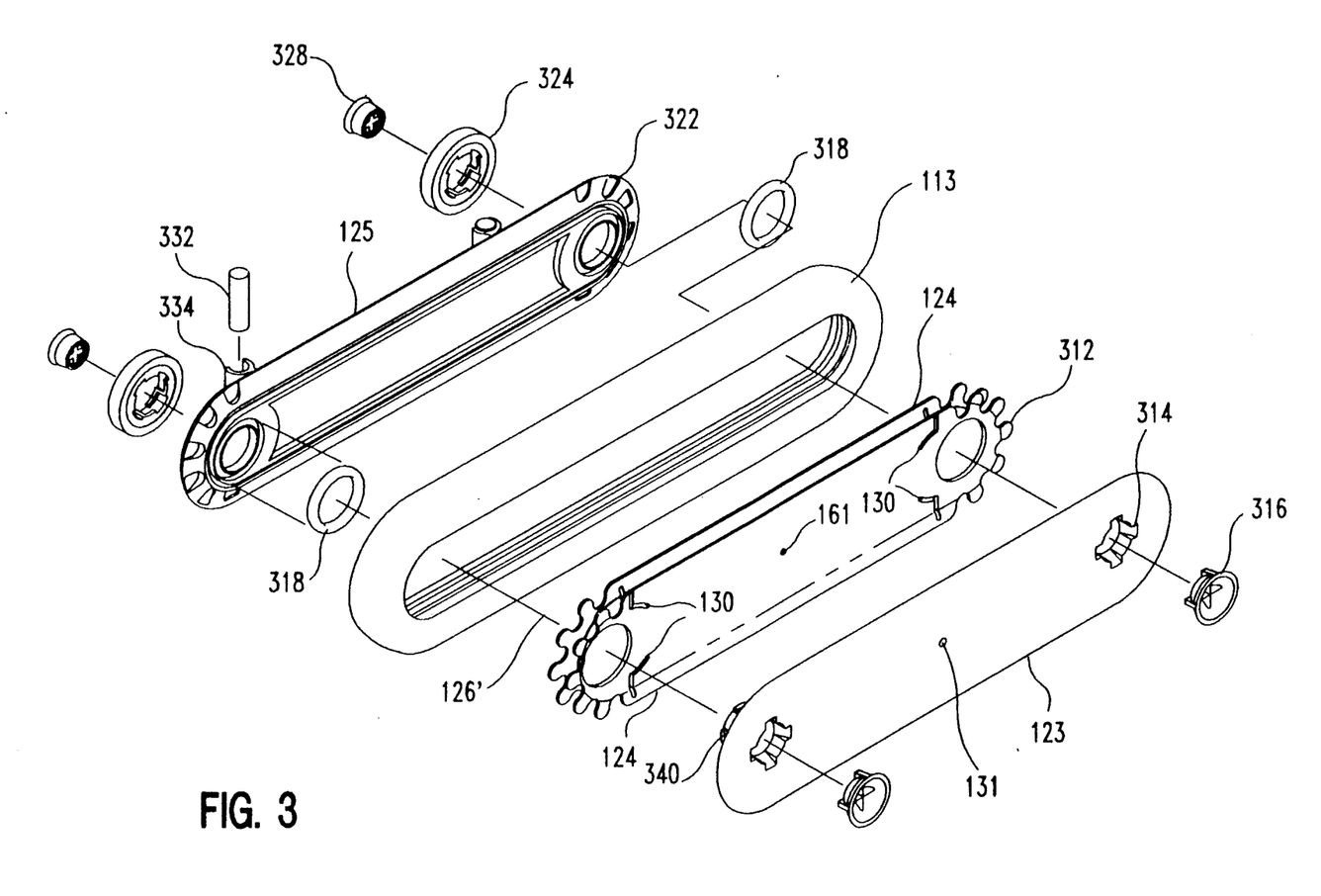
FIG. 3 is an exploded view of an alternative embodiment of the closure member structure in accordance with the invention showing some preferred features thereof.

Location of the front and rear plates 123 and 125 relative to the backbone 124 is preferably facilitated by cylindrical housings 340 (only one of which is shown by cutting away the edge of front plate 123 in FIG. 3) secured to the back of front plate 123 centered on center lines 126 and 126' respectively. Cylindrical housings 340 extend through holes in the backbone 124 and back plate 125, which holes are also aligned with center lines 126 and 126' respectively. On the back side of back plate 125, the retaining nuts 324 are pushed over the ends of cylindrical housings 340, so nuts 324 lock onto cylindrical housings 340 by turning them into a locked position as is well-understood by those skilled in the art.

Alternatively, the front and back plates 123, 125 and the backbone 124, together with other closure member structure can be joined together by pins extending from either or both of the front and back plates 123, 125 and/or backbone 124 and welded, bonded or otherwise affixed at the front and back plates 123, 125 to secure the closure member assembly together. Also, as best shown in FIG. 2, the edges of the front and back plates are preferably shaped to engage closely with the margins of the resilient seal member 113 which are preforably angled to give the resilient seal member an overall appearance, in cross-section, of the Greek letter "Ω".

This structural configuration provides a particularly gas-tight seal between these parts, allowing the seal member 113 to be pressurized and such pressure maintained for extended periods of time to tightly seal the closure member 112 of isolation structure 100.

Front plate 123 also has an aperture 131 cooperating with the manifolding provided by backbone 124 to allow the interior of the resilient seal member 113 to be pressurized or evacuated. At least the front surface of the front plate 123 also preferably provides a flat surface for facilitating engagement by a vacuum closure member removal plate 114 which will be discussed below. The backbone 124 and front and back plates 123, 125 are preferably formed of the same material as the shell 110. However, transparency is not normally required, providing slightly greater latitude in choice of materials.

Manifolding 130 can be fabricated in many forms, such as with tubes or hollow structures within the backbone 124. However, an extremely simple preferred structure may be formed simply as grooves or recesses in the sides of the backbone 124 (indicated at 160) or the abutting faces of the front and/or rear plates 123, 125 (indicated at 160'). The manifolding is preferably formed on both sides of the backbone 124 with at least one communicating hole 161 through the web of the backbone 124. Corresponding holes are also formed at the locations of the grooves in the cup-shaped edges 132 of the backbone 124. The grooves or recesses may be formed by embossing, casting or machining or other methods. If the manifolding is formed as grooves, the grooves need only be deep enough to prevent closure member by the resilient seal member being pressed into the grooves when the front and rear plates are attached. Thus the grooves serving as pneumatic manifolding 130, in cooperation with the abutting inner faces of the front and rear plates 123, 125 complete a manifold which can communicate a desired pressure or vacuum from opening 131 on a preferably smooth or flush outer surface of the front plate 123 to the interior of the resilient seal member 113. The pressure or partial vacuum in the interior of the resilient seal member 113 can be maintained by providing appropriate closure member for opening 131.

Front and rear plates 123, 125 and backbone 124 also have apertures for receiving a filter or breather body 316 along centerline 126 in FIG. 3 to allow equalization of pressure between the interior and exterior of the shell 110 without the introduction of particulate contaminants. The shell 110 may also be purged with a gas such as an inert gas after sealing of the shell 110 by closure member 112 by means of breather body 316. However, it is preferable to provide at least two such breather bodies 316 with filters 328 to allow a gas to be more readily circulated throughout the shell.

Rear plate 125 is also preferably provided with a hygroscopic body 128 and a vapor absorptive body 127 affixed thereto, referred to hereinafter as drains. These absorptive bodies and filter 328 are readily removable from the assembled closure member 112 prior to cleaning. New filters and drains are fitted to closure member 112 when the closure member is to be reused.

Also, as best shown in FIG. 2, the opening 90 of the shell has the overall form of a groove between an interior shoulder 133 and a similar exterior shoulder 133' around the entire periphery thereof. These shoulders 133, 133' are of a dimension which does not reduce the outline of the opening 90 beyond the cross-sectional dimensions of the interior of the shell 110. The groove also preferably is shaped to include a preload ridge 134 to enhance the sealing effect against resilient seal member 113.

Shell 110 may also be fitted with a liner 150 (FIG. 2) which may function as a guide or holder for items placed therein. This liner preferably has a tapered edge 151. Alternatively, such a tapered region could be formed integrally with shell 110 or shell portions 111, 111'. The rear plate 125 of closure member 112 is also preferably tapered to cooperate therewith to provide a smooth interior surface of the isolation structure 100.

A tapered edge 138 is also formed on the periphery of front plate 123 to cooperate with an outer portion of the profile of outer shoulder 133'. This tapered region provides a periphery of the front plate which is larger than the periphery of resilient seal member 113 when retracted by evacuation, as shown by dashed lines 137, to reduce the risk of damage thereto. Further, when the resilient seal member 113 is pressurized or otherwise allowed to resiliently expand, the seal exerts a camming action against the inner portion of the profile of outer groove shoulder 133' until the tapered edge of the front plate 123 is seated against the outer portion of the profile of shoulder 133'. At the same time, the tapered edge of the rear plate 123 is seated against the tapered region 151. This interfitting of surfaces provides a particularly secure positioning of the closure member 112 within the opening 90 and, in particular, prevents the closure member 112 from being pushed inward to apply mechanical forces against items contained within the isolation structure 100. This seating of tapered structures also assures that the interior dimensions of the isolation structure 100 will not be altered by the seal member 113 or changes in the condition thereof.

Rear plate 125 is also preferably provided with a resilient buffer member 129, which is preferably dimensioned to apply a slight positioning force against an item placed in the isolation structure 100 when the closure member 112 is in place. Opposing positioning forces are applied to the item by resilient buffers 143, shown in FIG. 1. The opposing resilient pads 143 thus provide substantial protection of the item against impacts applied to the isolation enclosure member 100. Preferably the material chosen for these resilient buffers 143 also provides a damping effect and thus provides protection against vibration being transmitted from the exterior of the isolation structure to the contents thereof. Suitable materials include Fluoro (FLUORE(R)), Urethane (ELASTILAN(R)), Polyester (ELASTILAN(R)) or Buns-N.

In order to seal or open the isolation structure 100, a vacuum plate 114 is preferably used. In order to capture and manipulate the closure member 112, the vacuum plate 114 must include a raised resilient seal member 135 (e.g. an O-ring or suction cup) which is preferably located to surround the location of aperture 131 in order to conveniently evacuate the resilient seal member 113 through manifolding 130 in the structure of backbone 124. It is especially preferable for raised resilient seal member 135 to extend around the entire periphery of the vacuum plate 114. This location provides the optimum application of frictional engagement forces between the raised resilient seal member 135 and the front plate 123 of the closure member 112 for manipulation thereof. However, in addition to this location for the raised resilient seal member 135, one or more further, similar seals must be provided to prevent vacuum from being applied to the interior of the isolation structure through breather, which may preferably be an assembly of several elements indicated by center line 126. This preferably done by providing )-ring seals 318 and 136 (shown in phantom in FIG. 1), an will be discussed in greater detail below.

Further, for opening 90 of the isolation structure after the outer surface thereof has been exposed to contamination, this location of the raised resilient seal member 135 provides a sealed chamber to contain the contamination. Any contamination present cannot escape the chamber due to the vacuum applied. This feature considerably reduces the difficulty of maintaining clean processing conditions within processing apparatus. For example, the shell of the isolation structure need not be introduced into processing equipment but merely placed against an aperture in a cover thereof. A contaminated cover can be withdrawn and the contamination fully contained by automated mechanisms within the processing apparatus while the contents of the isolation structure is removed. The cover can then be replaced and the contaminated isolation structure removed and the processing apparatus cover resealed with little or no opportunity for contamination of the interior of the processing apparatus to occur.

Referring now to FIG. 3, a preferred structure for several of the constituent parts of closure member 112 will be described. A preferred form of backbone 124 includes a toothed periphery at the rounded ends thereof. These tooth, such as shown at 312 in FIG. 1, provide gaps which improve gripping and sealing of the margin of resilient seal member 113. It should be noted in this regard that a suitable resilient seal member 113 made of an elastomeric material is commercially available but is shaped in a generally circular rather than an elongated oval form. Straightening the curvature of this commercially available seal 318 along the linear portions of the backbone stretches the inner periphery and does not affect the sealing action between the backbone 124 and the front and rear plates 123, 125. However, where the curvature is increased, the inner margin is compressed. Therefore, the teeth 312 are advantageous in accommodating the compressed material in these regions while gripping the resilient seal member against corresponding ribs 322 between recesses formed in the front and rear plates. It is considered preferable that the ribs 322 and teeth 312 be opposed to each other rather than interleaved since the serpentine shape into which the seal margin would be forced, in the latter case, provides an inferior seal and concentrates forces during insertion of the closure member into the shell opening 90 which could tear or otherwise degrade the resilient seal member.

A preferred structure for the resilient buffers 129 in formed by insertion of cylindrically shaped buffers 332 into brackets 334 which may be formed integrally with or attached to the rear surface of rear plate 125. Buffers 332 are preferably force fit into these brackets 334 so that the resilient material thereof will be retained therein and also deformed slightly to protrude in the direction of application of force to the contents of the isolation structure.

A preferred form of the breather 126 is also shown in FIG. 3 which also performs the function of locating ping 125' of FIG. 1. Breather body 316 which is generally cone-shaped Is provided which preferably has protrusions thereon which key into notches 314 in apertures formed in front plate 123. The breather body 316 thus reaches through all of the front plate 123, backbone 124 and rear plate 125. An O-ring seal is provided around the breather body 316 within apertures in the backbone 124. Thus when the breather body 316 is placed in tension, preferably by the installation of a quarter-turn nut affixed thereto, the O-ring is flattened and deformed against the interior of the aperture in the backbone 124 while maintaining a slight separation of the front and rear plates 123, 125 therefrom until the parts are fully seated against each other and in engagement with resilient seal member 113. In this fashion, the front and rear plates 123, 125 and the backbone 124 are made self-aligning during assembly. Filter elements 328 are then carried by the interior surfaces of the breather body 316.

Figure 4:
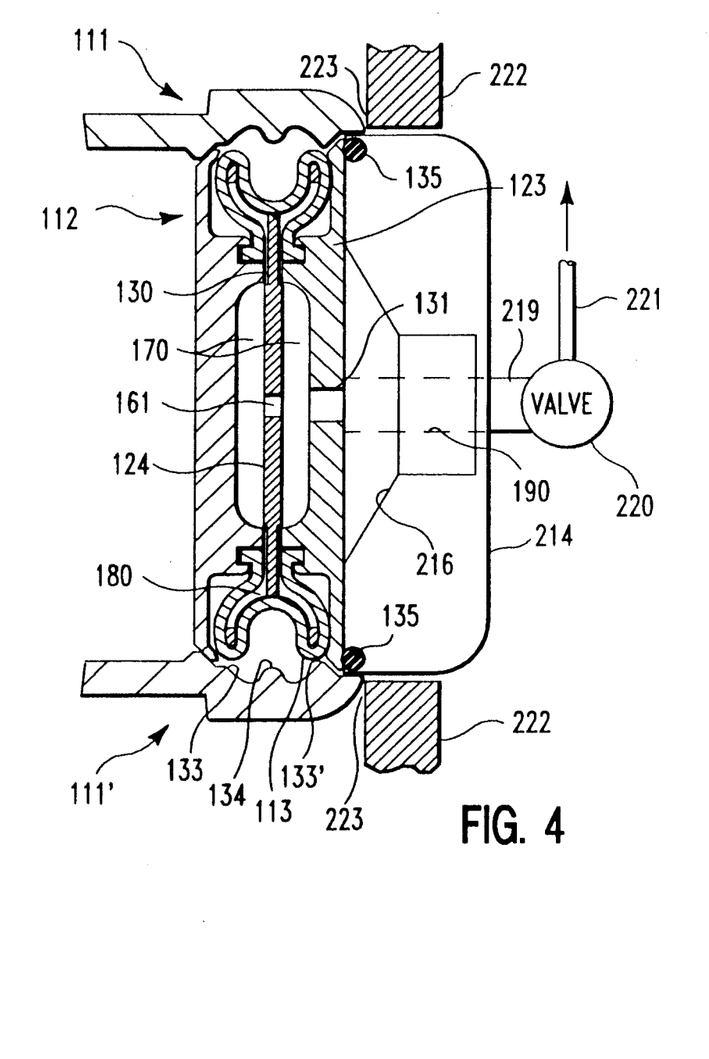
FIGS. 4 and 5 illustrate the process of unlatching the closure member of the isolation enclosure member in accordance with the invention.

Referring to FIG. 1, the closure member 112 of the isolation structure 100 is preferably operated by capturing the closure member 112 with a vacuum plate 114 of the form discussed above after removing any closure member of opening 131, if necessary. The application of a partial vacuum to the surface of the front plate 123 is also communicated through manifold 130 to the interior of resilient seal member 113 which then assumes the collapsed shape indicated at 137 in phantom in FIG. 2, or as shown in FIG. 4 in greater detail. The closure member 112 can then be easily seated or removed, as desired since the seal member 113 is collapsed, permitting the closure member to be opened without the resistance of the seal member 113.

The ends of the cup-shaped edges of the backbone 124 are preferably dimensioned to provide a sliding fit over groove shoulder 133'. While some wear on the resilient seal member will occur unless a clearance is provided, a sliding contact will provide the most secure closure member and seal of the closure member 112. Any significant wear which occurs will be easily detectable by inspection. Further, a two-step, detent-like action will be provided by the ends of the cup-shaped edges of the backbone 124 which can be sensed the closure member 112. The detent action will also hold the closure member 112 in a correct position relative to shell 110 while the resilient seal member 113 is allowed to expand or is pressurized.

It should be noted that when the closure member 112 is correctly seated, there are no grippable projections on either the surface or the edges of the closure member 112. The preferably bevelled or tapered edges of the closure member 112 are closely fitted to and slightly recessed below the edge of shell 110. The resiliency of the resilient seal member 113 at the edges of the backbone 124 and front and rear plates 123 and 125 is preferably chosen such that it cannot be collapsed by evacuation which is less than the partial vacuum required to firmly grip the closure member 112 by vacuum plate 114. Thus, the isolation device 100 is made highly resistant to tampering and cannot be opened without severe and visible damage to the shell 110 or closure member 112 of the isolation structure, or both.

Figure 5:
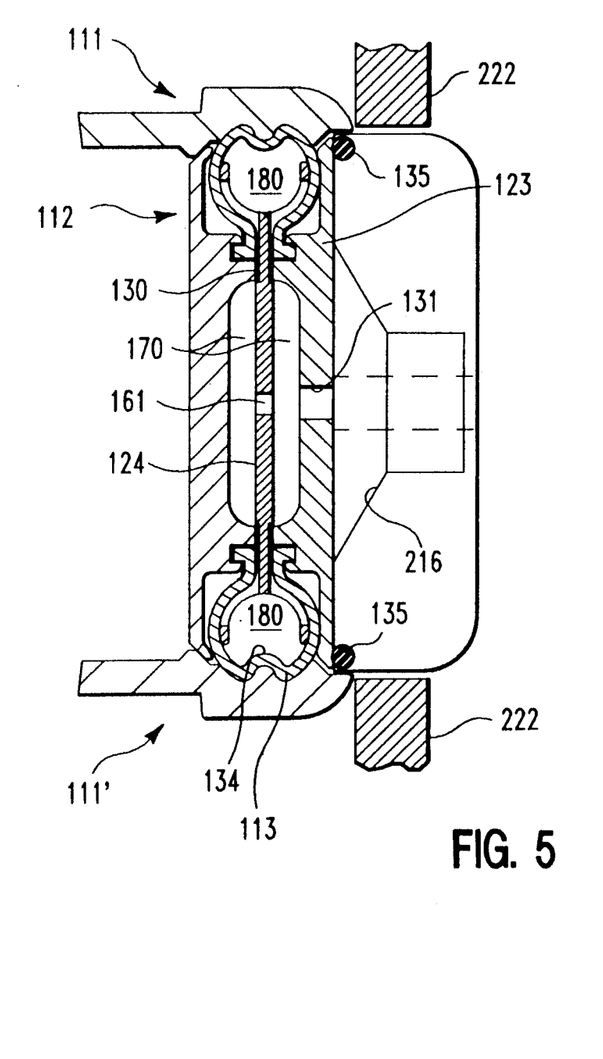

The preferred process of closing and opening of the isolation enclosure member in accordance with the invention, together with a preferred form of vacuum closure member removal structure 214, will now be described in detail with reference to FIGS. 4 and 5. Specifically, closure member removal structure 214 has a generally planar surface for mating with the exterior surface of closure member 112 at the front plate 123 thereof. This mating surface of structure 214 preferably includes the resilient seal member 135 serving as means for establishing a good pneumatic seal against the closure member front plate 123, such as a raised resilient seal member 135. The seal 135 is effective regardless of minor warpage, scratches and the like existing on the outer surface of the closure member 112. The closure member removal structure 214 also preferably includes a vacuum line 190 and a recess 216 (in the hollow conical shape of a suction cup) of substantial volume which may be a separate structure within the closure member removal structure 214, preferably in the form of at least one suction cup shape in recess 216. Vacuum line 190 is preferably located centrally of the suction cup shape in recess 216 and concentrically with aperture 131 in front plate 123. Further, vacuum line 190 has a length which provides a small clearance (e.g. less than the radius of aperture 131 in order to provide preferential evacuation of manifolding 130 in the closure member 112 when a sufficient level of vacuum has been achieved for fully gripping the closure member 112 because of the vacuum pressure. This arrangement of evacuated volumes allows enhanced gripping of the closure member 112 since any leakage at resilient seal member 135 or recess 216 results in only a relatively slow loss of vacuum in view of the preferably relatively large total volume of the manifolding 130 and interior volume of the closure member removal structure 214, including the volume within the seal 135 and within suction cup 216. Any such partial loss of vacuum will increase the clearance between vacuum line 190 and the front face of front plate 123 of closure member 112. This tends to evacuate the recess 216, preferentially, until full vacuum gripping in again established. It should be understood that in such an occurrence, after the resilient seal member 113 has been collapsed as shown in FIG. 4, such a partial loss of vacuum will not immediately reseal the closure member 112 since return of pressure to the interior of resilient seal member 113 will be limited by the small cross-sectional area of the manifolding 130 at grooves 160.

Thus the vacuum gripping of the closure member 112 and the collapse of the seal will be stabilized even in the presence of minor leakage through or about the closure member removal plate 114, Thus to the baffle formed by the clearance between the vacuum line 190 and the front face of front plate 123. By virtue of the same structure, when gripping is initiated after positioning of closure member removal plate 114 against the closure member 112, the clearance between the closure member 112 and the end of vacuum line 190 will be somewhat greater than the final location and the recess 216 and the remainder of the volume within resilient seal member 135 will be achieved before a vacuum is pulled on the manifolding 130 and, in turn, on the interior of resilient seal member 113 due to the restriction on gas flow at groove 160 of manifolding 130. Therefore, gripping of the closure member 112 by the closure member removal structure 214 under vacuum pressure is assured prior to the collapsing of resilient seal member 113.

For gripping of the closure member 112, closure member removal plate 114 is placed against the outer surface of closure member 112 and a vacuum is applied to vacuum line 221 through a valve 220 and thence to the interior of the is preferably attached to valve 220 or vacuum line 221 through a threaded fitting 219. As indicated above, the clearance between the vacuum line 190 and the front of the closure member 112 will first cause a vacuum to be drawn more strongly on the interior space defined by recess 216 of the closure member removal structure 214 and thereafter drawn more strongly through aperture 131 to space 170 which is connected to manifolding 120 to draw a vacuum on the manifolding 130. After vacuum gripping has been accomplished and as vacuum is drawn on manifolding 130, vacuum is drawn somewhat more slowly on the interior of resilient seal member 113 on the periphery of the closure member 112 to collapse the resilient seal member 113. Once the resilient seal member 113 is collapsed, the closure member removal structure 214 can be drawn back, while held with vacuum applied by structure 214 and seal 135 preferably within a clean environment indicated by housing wall portions 222 to allow access to the interior or contents of the enclosure member 110. In this connection, it may also be desirable to provide a seal or support for enclosure member 111 where it abuts wall portions 222, as generally indicated at 223, to provide further protection against contamination.

After placement of an article within the shell 110 (FIG. 1) or removal therefrom, the closure member 112 may be replaced and resealed by merely releasing the vacuum by closing valve 220 and allowing resilient seal member 113 to expand to its original shape as installed on closure member 112. The release of the vacuum Is preferably regulated so that the resilient seal member 113 will resume its original shape and seal the enclosure member more or less concurrently with the release of the closure member 112 by closure member removal structure 214. In this regard, the clearance between vacuum line 190 and the front surface of closure member 112 can be of assistance in regulating the timing of the closure member release to the expansion of resilient seal member 113. In any event, the mechanical pressure on the closure member removal structure 214 against closure member 112 maintains the closure member 112 seated against the shell 110 and timing of the release and the expansion of resilient seal member 113 to seal and lock closure member 112 in the opening 90 is not particularly critical. Positive pressure in vacuum line 221 coupled to manifolding 130 through vacuum line 190 can also be advantageously used to speed expansion of resilient seal member 113 and, if desired, manifolding 130 can be pressurized and sealed to enhance the gripping of shell 110 by the resilient seal member 113.

While this invention has been described in terms of the above embodiment(s), those skilled in the art will recognize that the invention can be practiced with modifications within the spirit and scope of the appended claims.

Having thus described the invention, what is claimed is new and desirable and desired to be secured by Letters Patent is as follows:

1. A system for opening and closing an isolation structure comprising:
   said isolation structure including
      a shell having an interior adapted to accommodate a contamination sensitive item and having an opening leading to said interior, and
      a closure member adapted to engage and disengage said shell opening, said closure member having
         a closure member being having an outer periphery and a resilient seal on said outer periphery, said resilient seal and said closure member body defining a first volume therebetween, said closure member body further having a rear surface facing said shell interior when said closure member is received within said shell opening and a front surface opposite said rear surface, said front surface having at least one aperture therein, and a manifold for communicating pneumatic pressure between said first volume and said at least one aperture in said front surface, and holding means for engaging and disengaging said closure member from said shell opening, said holding means including a structure adapted to removably engage said front surface of said closure member body in a sealed manner to define a second volume between said front surface and said structure, said holding means further including vacuum means for drawing a partial vacuum within said second volume and said second volume being in pneumatic communication with said first volume through said at least one aperture in said front surface.

2. A system as recited in claim 1, further including means for attaching said resilient member to said closure member body.

3. A system as recited in claim 1, wherein said closure member body includes a backbone and means for attaching said resilient member to said backbone including front and rear plates, said front plate including said front surface.

4. A system as recited in claim 3, wherein a portion of said manifold is formed by grooves located on a surface of said backbone.

5. A system in accordance with claim 1 wherein said system captures said closure member by employing a cover with a perimeter seal for evacuating said resilient seal when opening said closure member.

6. A system in accordance with claim 1 wherein said system applies suction to said closure member to collapse said resilient seal.

* * * * *